(12) United States Patent
Koops et al.

(10) Patent No.: US 7,075,705 B1
(45) Date of Patent: Jul. 11, 2006

(54) METHOD FOR WAVELENGTH-SELECTIVE MIXING AND/OR DISTRIBUTION OF POLYCHROMATIC LIGHT

(75) Inventors: Hans Wilfried Peter Koops, Ober-Ramstadt (DE); John Sheridan, Dublin (IE); Martin Zuern, Ispra (IT)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/529,605

(22) PCT Filed: Sep. 25, 1998

(86) PCT No.: PCT/EP98/06131

§ 371 (c)(1),
(2), (4) Date: Oct. 18, 2000

(87) PCT Pub. No.: WO99/19754

PCT Pub. Date: Apr. 22, 1999

(30) Foreign Application Priority Data

Oct. 14, 1997 (DE) ................................ 197 45 324

(51) Int. Cl.
*G02F 1/00* (2006.01)
(52) U.S. Cl. ...................... 359/322; 359/320; 359/317; 398/86; 398/91
(58) Field of Classification Search ................ 359/322, 359/320, 317, 112.26, 112.13, 112.08, 321; 369/112.26, 112.13, 112.08; 398/86, 91
See application file for complete search history.

(56) References Cited

U.S. PATENT DOCUMENTS

| 4,244,045 | A | * | 1/1981 | Nosu et al. ..................... 370/3 |
| 5,973,823 | A | * | 10/1999 | Koops et al. ................ 359/322 |
| 6,052,213 | A | * | 4/2000 | Burt et al. ................... 359/237 |
| 6,075,915 | A | * | 6/2000 | Koops et al. ................ 385/125 |

FOREIGN PATENT DOCUMENTS

| DE | 29 03 288 | 8/1979 |
| DE | 196 28 355 | 3/1997 |
| DE | 196 34 893 | 5/1997 |
| DE | 196 10 656 | 9/1997 |
| DE | 196 16 324 | 10/1997 |
| DE | 197 20 926 | 11/1997 |
| EP | 651 529 | 5/1995 |
| EP | 730 173 | 9/1996 |
| JP | 08 184 730 | 11/1996 |

OTHER PUBLICATIONS

Koops et al., "Photonic Crystals Built by Three-Dimensional Additive Lithography Enable Integrated Optics of High Density," Proceedings of the SPIE, Bd. 2849, Aug. 5, 1996, pp. 248-249.
AT&T Statement 7.96 (regarding Bragg gratings)-reference not currently available to us.

* cited by examiner

Primary Examiner—Timothy Thompson
(74) Attorney, Agent, or Firm—Kenyon & Kenyon LLP

(57) ABSTRACT

A method for wavelength-selective mixing and/or distribution of polychromatic light. When mixing polychromatic light, lights having only one wavelength are successively fed to each member of a selective chain to form a partial spectrum, and when distributing chromatic light, one wavelength is filtered out of each member and the remaining spectrum is fed after reflection to the next member for being further decomposed. A chain of photonic crystals is used both for mixing and distributing and a wavelength-selective coupler/decoupler is associated to each crystal. Fields of application include the wavelength-selective mixture or distribution of polychromatic light and spectrometric measurements and environment monitoring.

13 Claims, 3 Drawing Sheets

METHOD FOR WAVELENGTH-SELECTIVE MIXING AND/OR DISTRIBUTION OF POLYCHROMATIC LIGHT

FIELD OF THE INVENTION

The present invention relates to a method for wavelength-selective mixing and/or distribution of polychromatic light.

RELATED TECHNOLOGY

A process for wavelength-selective mixing and/or distribution of polychromatic light, employing conventional dielectric mirrors and optical prisms as serially arranged wavelength-selective components in an assembled set-up on which beamed-in polychromatic light is reflected, is described, for example, in German Patent Document No. 29 03 288 A.

New-type filters for splitting the wavelength mixture can also be constructed from photonic crystals, which, because of their geometrical arrangement, transmit a defined wavelength range and reflect the non-transmitted light backwards, i.e., with reversed light path. Such filters are described in German Patent Document No. 196 34 893 A. Owing to their design, however, such filters cannot split the light into two different paths into which different wavelength range are directed and distributed.

Further known spectrometers for splitting polychromatic light or light bundles of different given wavelengths, of the kind used for telecommunications in wavelength-division multiplexing and in optical measurement technology, are made of prisms, gratings or fiber gratings and split the incident spectrum into a plurality of spectrally limited light beams of small wavelength width.

Multiplexers and demultiplexers for splitting polychromatic light or light bundles of different wavelengths of the kind used in telecommunications are described, for example, in European Patent Document Nos. 0 730 173 A1 and 0 651 529 A1, which are hereby incorporated by reference herein, and wherein, for mixing, each link of a selective chain is supplied consecutively with light of a single wavelength in order to form a partial spectrum and, for distribution, a wavelength is filtered out in each link.

The above documents do not state in detail how to realize the spatial separation of the forwards-running and backwards-running waves, or what financial and spatial expenditure is necessary for gratings or fiber gratings to split the incident spectrum into a plurality of spectrally limited light beams of small wavelength width.

A disadvantage of the available processes and devices, particularly the spectrometers, is the great expense associated with the required precise construction and balancing.

Using the invention, it should be possible to implement the aforementioned procedure and, in particular, the devices as well, considerably more simply and inexpensively.

SUMMARY OF THE INVENTION

The present invention is directed to improving the processes noted above, especially with regard to cost, and to make the processes more simple to realize.

The present invention provides a method for wavelength-selective mixing of polychromatic light, the method including consecutively supplying each link of a selective chain with light of a respective single wavelength so as to form a respective partial spectrum after each link and a final spectrum after the selective chain, each link including a wavelength-selective input/output coupler integrated in a respective photonic crystal material and including a respective fixed selection window.

The present invention also provides a method for wavelength-selective distribution of polychromatic light, the method including separating the polychromatic light using a selective chain of links so as to filter out a respective reflection to a next link, each link including a wavelength selective input/output coupler integrated in a respective photonic crystal material and including a respective fixed selection window.

DETAILED DESCRIPTION

Wavelength-selective mixing and/or distribution is based on as simple and reliable a selection as possible when the spectrum is split into a plurality of spectrally limited light beams of small wavelength width, which are also the decisive feature of a spectrometer. The following description begins with application of the present invention for spectrometric measurements and can lead to a complete design as mixer and distributor.

Figure 1:
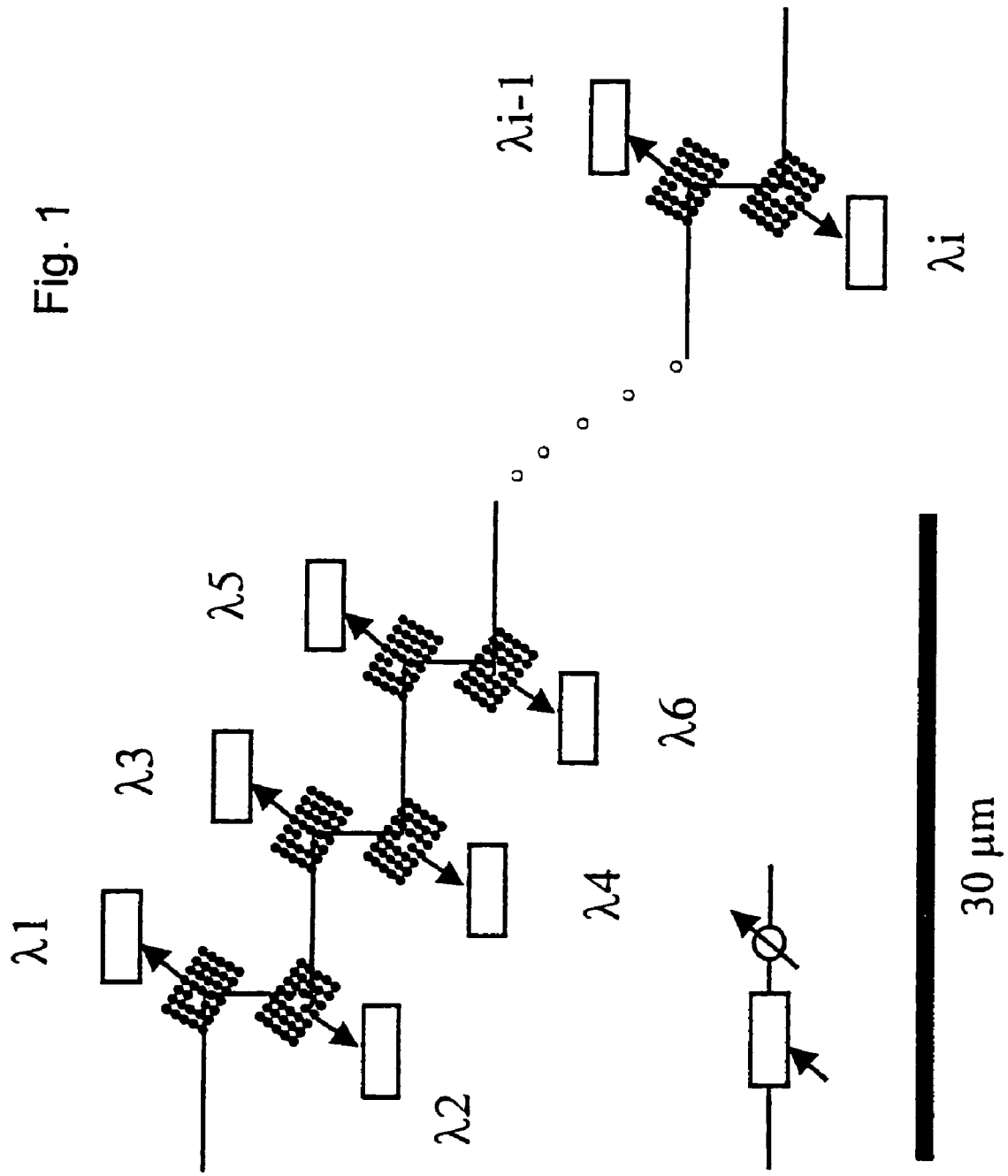
FIG. 1 shows a schematic diagram of a cascaded spectrometer, which includes photonic crystals and measures the light intensity, spectrally selected by the crystal, with a photoresistor at the output of the crystal.

According to FIG. 1, using photonic crystals 2. It may be possible to construct a spectrometer with which the wavelengths λ existing in the spectrum and to be investigated can be specifically and selectively coupled out and analyzed. For this purpose, for a measuring application as a spectrometer, in addition to known light-sensitive elements of a conventional type, such as phototransistors or charge-coupled devices or semiconductor diodes, it is possible to advantageously use a highly sensitive photoresistor made from nanocrystalline material according to German Patent Application Nos. 196 21 175.1 and 197 20 926.2, which are hereby incorporated by reference herein. Photonic crystals are described in German Patent Application Nos. 195 33 148.6 and 196 28 355.8, which are hereby incorporated by reference herein.

The construction of the spectrometer from photonic crystals of wavelength-specific type means that the spectrometer can be constructed in integrated manner on a chip together with the light-detecting element.

Consequently, such spectrometers may be made inexpensively available for environmental monitoring tasks at emission sources. These spectrometers can be commercially massproduced by lithographic processes with high-resolution etching masks produced by deposition or corpuscular-beaminduced deposition in the projection device and with high refractive index produced by silylation according to German Patent Application No. 196 16 324.2, which is hereby incorporated by reference herein. An on-chip spectrometer can be implemented in this manner.

Depending on the specified wavelength, using specially constructed, high-resolution, selectively-acting filters, it is possible in this case to select out only the wavelengths which are required for further processing. The method according to an embodiment of the present invention may provide a small overall size and in high achievable selectivity with regard to intensity and bandwidth.

The use of photonic crystals 2 in this arrangement for this task as well as the use for environmental monitoring and for digital wavelength-division multiplexing may be a part of the present invention.

Such a spectrometer of photonic crystals 2 for wavelength-selective beam splitting may be integrated into a waveguide pattern such that, always per crystal 2, one wavelength λ is filtered out from the overall spectrum, and the residual spectrum is supplied to the next crystal in the chain by high-efficiency reflection for further splitting and forwarding.

In FIG. 1, for measuring the intensity, the output of each spectrometer crystal is provided with a highsensitivity photoresistor, integrated into the arrangement, or with a conventional detector into which the light from the spectrometer crystal is coupled by waveguides or lenses.

Figure 2:
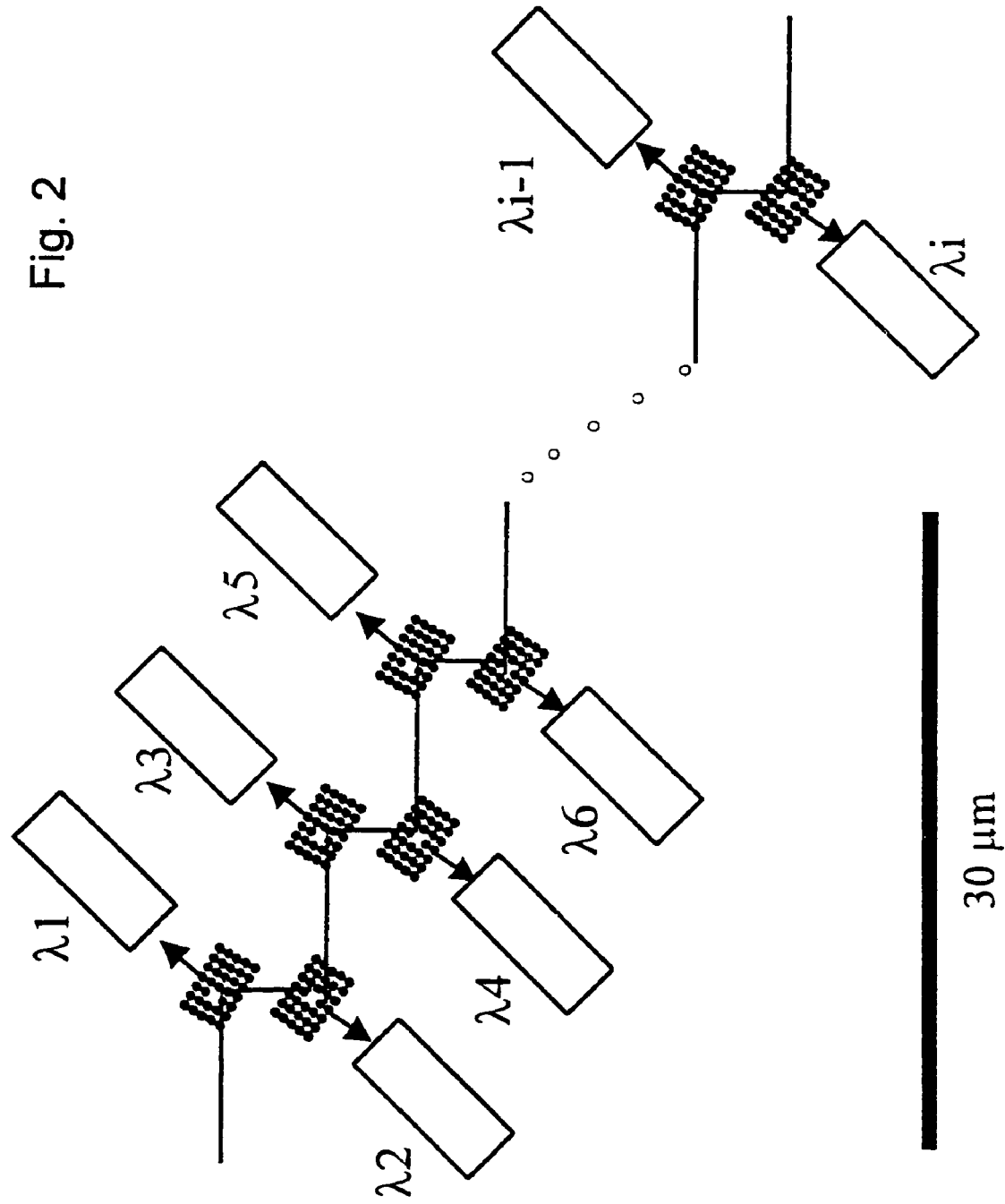
FIG. 2 shows a schematic diagram of a wavelength-selective demultiplexer which, from a spectrum, selectively couples or connects a defined wavelength into fibers and supplies said wavelength to further networks through coupled fibers.

According to FIG. 2, such a spectrometer, in the embodiment with photonic crystals 2, may be produced from deposited dielectric rods with likewise deposited resistor, using electron-beam-induced deposition. However, in the embodiment with photonic crystals 2, it can also be made from dielectric rods produced by dry etching, with deposited resistor which is produced by electron-beam-induced deposition.

Further, a spectrometer in the embodiment with photonic crystals can be produced with holes, produced by dry etching, in dielectric material, and with integrated deposited resistor which was produced by electron-beam-induced deposition.

The described spectrometers with photonic crystals may be fitted with connected optical fibers for each spectral channel according to FIG. 2 for the wavelength partition of the spectrum of a multi-wavelength transmission link. Such a component may also be used for individual wavelengths as mixer (add) and as distributor (drop).

Figure 3:
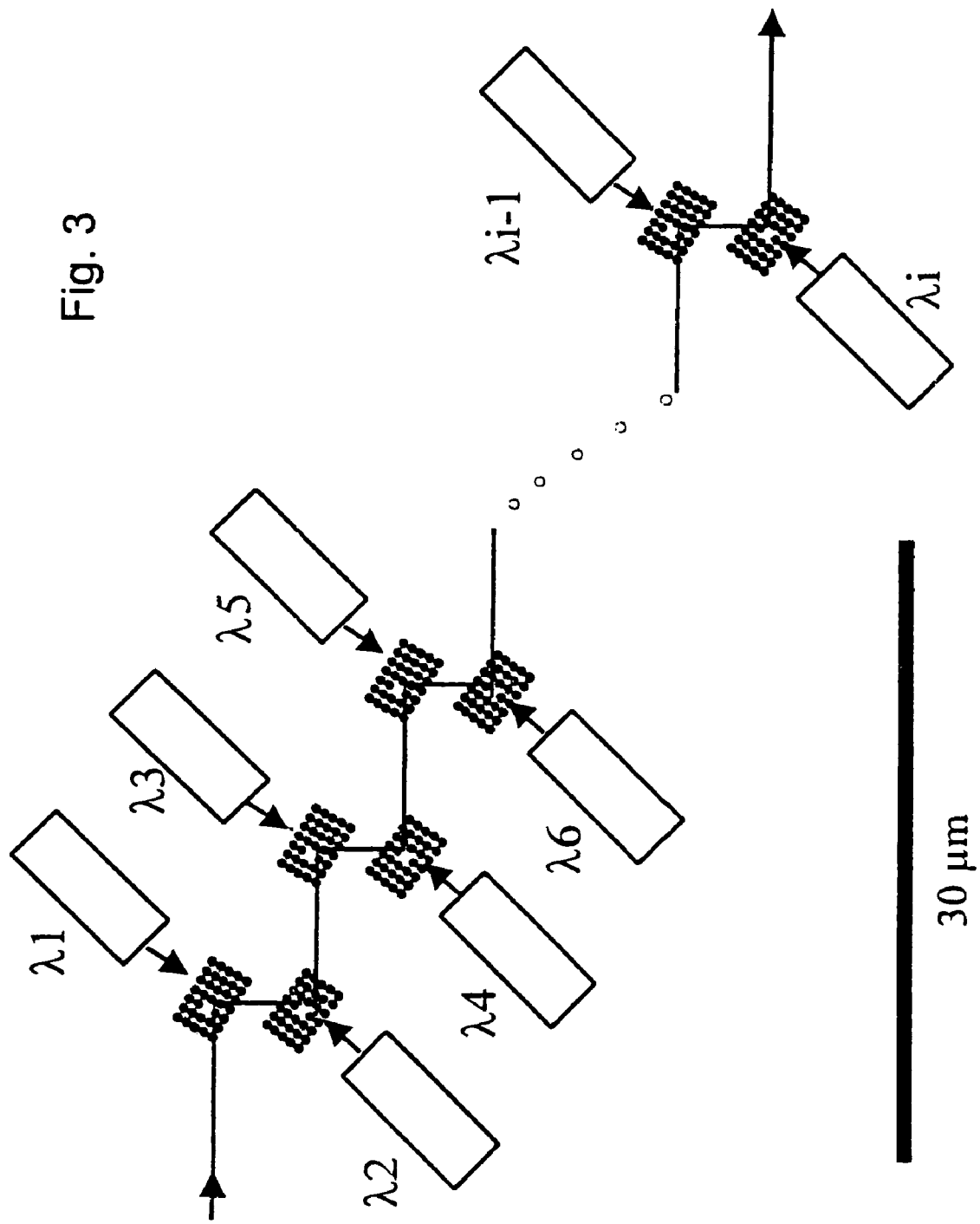
FIG. 3 shows a schematic diagram of a wavelength-selective multiplexer and adder which, for a spectrum, selectively couples or connects a defined wavelength into fibers and supplies said wavelength to further networks through coupled fibers.

According to FIG. 3, a synthesizer is formed by the modification of such a spectrometer, made of photonic crystals 2 for wavelength-selective beam splitting, integrated into a waveguide pattern in the arrangement, in that, always per crystal 2, one wavelength λ is filtered out from the overall spectrum and the residual spectrum is supplied to the next crystal in the chain by high-efficiency reflection for further splitting and forwarding.

In the opposite direction, the same elements of the spectrometer are operated as a synthesizer for the combining of a spectrum of individual laser wavelengths. Situated at the output of each spectrometer crystal for coupling-in the light of the defined wavelength is a fiber laser or laser connection with which the spectrum can be composed in a very small space.

Such a synthesizer (ADD) can, with connected optical fiber per spectral channel, be used for the wavelength composition of a spectrum with one or more further wavelengths which are to be added to a multi-wavelength transmission link without influencing the spectrum of the link.

What is claimed is:

1. A method for wavelength-selective mixing of polychromatic light, the method comprising:

consecutively supplying each link of a selective chain with light of a respective single wavelength so as to form a respective partial spectrum after each link and a final spectrum after the selective chain, each link including a respective wavelength-selective input/output coupler integrated in a respective photonic crystal material and including a respective fixed selection window, wherein a residual spectrum of the each link is supplied to another link of the selective chain for splitting.

2. The method as recited in claim 1 wherein the selective chain includes characteristics of a spectrometer.

3. The method as recited in claim 1 further comprising transmitting the final spectrum.

4. The method as recited in claim 1 wherein each respective photonic crystal material includes respective dielectric rods deposited by a first electron-beam-induced deposition and wherein each link includes a respective resistor deposited by a second electron-beam-induced deposition.

5. The method as recited in claim 1 wherein each respective photonic crystal material includes respective dielectric rods deposited by dry-etching and wherein each link includes a respective resistor deposited by electron-beam-induced deposition.

6. The method as recited in claim 1 wherein each respective photonic crystal material includes holes made by dry etching in the respective dielectric material and a respective integrated resistor deposited by electron-beam-induced deposition.

7. The method as recited in claim 1 wherein each respective input/output coupler is associated with a respective connection for at least one of an optical fiber, a fiber laser and a laser.

8. The method as recited in claim 1 wherein each respective input/output coupler is associated with a respective detector and with a respective connection for at least one of an optical fiber, a fiber laser and a laser connection.

9. A method for wavelength-selective mixing and/or distribution of polychromatic light, the method comprising:

consecutively supplying each link of a selective chain with light of a respective single wavelength so as to form a respective partial spectrum after each link and a final spectrum after the selective chain;

separating at least one of the respective partial spectrum or the final spectrum using the selective chain so as to filter out the respective wavelength in each link and provide a respective residual spectrum after a respective reflection to a next link;

each link including a wavelength-selective input/output coupler integrated in a respective photonic crystal material and including a respective fixed selection window, wherein the selective chain of photonic crystal material has dielectric rods produced by dry etching and a respective resistor, produced by electron-beam-induced deposition.

10. The method as recited in claim 9 wherein the selective chain includes characteristics of a spectrometer.

11. The method as recited in claim 9 further comprising transmitting the final spectrum.

12. The method as recited in claim 9 wherein each respective input/output coupler is associated with a respective connection for at least one of an optical fiber, a fiber laser and a laser.

13. The method as recited in claim 9 wherein each respective input/output coupler is associated with a respective detector and with a respective connection for at least one of an optical fiber, a fiber laser and a laser connection.

* * * * *